US012014901B2

(12) United States Patent
Chen et al.

(10) Patent No.: US 12,014,901 B2
(45) Date of Patent: Jun. 18, 2024

(54) TAILORED ELECTRON ENERGY DISTRIBUTION FUNCTION BY NEW PLASMA SOURCE: HYBRID ELECTRON BEAM AND RF PLASMA

(71) Applicant: Tokyo Electron Limited, Tokyo (JP)

(72) Inventors: Zhiying Chen, Austin, TX (US); Peter Ventzek, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/170,119

(22) Filed: Oct. 25, 2018

(65) Prior Publication Data

US 2020/0135431 A1 Apr. 30, 2020

(51) Int. Cl.
*H01J 37/32* (2006.01)

(52) U.S. Cl.
CPC .. *H01J 37/32357* (2013.01); *H01J 37/32146* (2013.01); *H01J 37/32174* (2013.01)

(58) Field of Classification Search
CPC .......... H01J 37/32357; H01J 37/32146; H01J 37/32174; H01J 37/3065; H01J 37/3341; H01J 37/3233; H01J 37/32899; H01J 37/32009–32339; H01J 2237/3341; C23C 16/487; C23C 16/486; C23C 16/0263; H01L 21/3065
See application file for complete search history.

(56) References Cited

U.S. PATENT DOCUMENTS

| | | | |
|---|---|---|---|
| 3,626,141 | A | 12/1971 | Daly |
| 3,789,320 | A | 1/1974 | Hepburn |
| 4,137,988 | A | 2/1979 | Croix-Marie |
| 4,201,905 | A | 5/1980 | Clark et al. |

(Continued)

FOREIGN PATENT DOCUMENTS

| | | |
|---|---|---|
| DE | 4104344 A1 | 9/1991 |
| DE | 4234788 A1 | 4/1994 |

(Continued)

OTHER PUBLICATIONS

Japanese Office Action issued in counterpart patent application JP 2011-500969, dated Feb. 26, 2013.

(Continued)

*Primary Examiner* — Benjamin Kendall
(74) *Attorney, Agent, or Firm* — Oblon, McClelland, Maier & Neustadt, L.L.P.

(57) ABSTRACT

Embodiments of hybrid electron beam and RF plasma systems and methods are described. In an embodiment a method of using a hybrid electron beam and RF plasma system may include forming a first plasma of a first type in a first region of a wafer processing structure. Additionally, such a method may include forming a second plasma of a second type in a second region of the wafer processing structure, the second region of the wafer processing structure being coupled to the first region of the wafer processing structure, the second plasma being ignited independently of the first plasma, wherein an electron beam formed by the first plasma is configured to modulate one or more charac- (Continued)

teristics of the second plasma. This hybrid e-beam and RF plasma system provides a source to control electron energy distribution function.

8 Claims, 4 Drawing Sheets

(56) References Cited

U.S. PATENT DOCUMENTS

| | | | |
|---|---|---|---|
| 4,229,709 A | 10/1980 | McMahan | |
| 4,316,157 A | 2/1982 | Dosi et al. | |
| RE31,042 E | 9/1982 | Clark et al. | |
| 4,544,824 A | 10/1985 | Knuttson et al. | |
| 4,550,241 A | 10/1985 | Scott et al. | |
| 4,563,567 A | 1/1986 | Geffroy et al. | |
| 4,675,497 A | 6/1987 | Pearl et al. | |
| 4,878,127 A | 10/1989 | Zollman et al. | |
| 5,061,839 A | 10/1991 | Matsuno et al. | |
| 5,468,955 A | 11/1995 | Chen et al. | |
| 5,827,435 A | 10/1998 | Samukawa | |
| 6,352,049 B1* | 3/2002 | Yin | H01J 37/32871 118/723 AN |
| 6,407,399 B1* | 6/2002 | Livesay | H01J 1/36 250/398 |
| 6,467,922 B1 | 10/2002 | Blanc et al. | |
| 6,573,473 B2 | 6/2003 | Hunter et al. | |
| 7,371,993 B2 | 5/2008 | Bann et al. | |
| 9,520,275 B2 | 12/2016 | Chen et al. | |
| 2001/0016166 A1 | 8/2001 | Dandl et al. | |
| 2004/0207824 A1 | 10/2004 | Lof | |
| 2004/0219737 A1 | 11/2004 | Quon | |
| 2008/0149605 A1 | 6/2008 | Sykes | |
| 2010/0068415 A1 | 3/2010 | Cabarrocas et al. | |
| 2011/0177694 A1* | 7/2011 | Chen | H01L 21/0337 438/710 |
| 2012/0019143 A1 | 1/2012 | Kadrnoschka et al. | |
| 2014/0265855 A1* | 9/2014 | Dorf | H01J 37/3233 315/111.31 |
| 2014/0339980 A1* | 11/2014 | Wu | H01J 37/3244 315/5.13 |
| 2015/0041432 A1* | 2/2015 | Chen | H01J 37/32082 216/66 |
| 2016/0064231 A1* | 3/2016 | Agarwal | H01L 21/3065 438/712 |
| 2017/0125217 A1* | 5/2017 | Dorf | H01J 37/3233 |

FOREIGN PATENT DOCUMENTS

| | | |
|---|---|---|
| DE | 10200400995 A1 | 9/2005 |
| EP | 03060890 | 3/1991 |
| GB | 2400063 | 10/2004 |
| JP | 11162831 | 6/1999 |
| JP | 2001269788 | 10/2001 |
| JP | 2004-289126 | 10/2004 |
| WO | WO2004/087363 | 10/2004 |

OTHER PUBLICATIONS

Chinese Office Action issued in counterpart patent application CN 200980110185.9, dated Mar. 5, 2013.
Heason, D.J., et al., "Modifying the IEDFs at a Plasma Boundary in a low-pressure RF Discharge Using Electron Beam Injection," Institute of Physics Publishing, Plasma Sources Science and Technology, PII: S0963-0252(01) 28404-7, Plasma Sources Sci. Technol. 10 (2001) pp. 627-635.
Gyergyek, T., et al., "Potential Formation in Front of an Electron Emitting Electrode Immersed in a Plasma that Contains a Monoenergetic Electron Beam," Physics of Plasmas 17, 083504 (2010).
Sydorenko, D., et al., "Excitation of Plasma Oscillators Near the Edges of a Plasma by an Intense Electron Beam in a DC Discharge," University of Alberta, Edmonton, Alberta, Canada, Princeton University, Princeton, NJ, USA, Tokyo Electron America, Austin, TX, USA, pp. 1-5.
International Bureau of WIPO, International Preliminary Report on Patentability issued in corresponding International Application No. PCT/US2014/036608, dated Dec. 17, 2015, 9 pp.
International Search Authority, International Search Report and Written Opinion issued in corresponding PCT Application No. PCT/US2014/036608, dated Sep. 4, 2014, 11 pp.

* cited by examiner

TAILORED ELECTRON ENERGY DISTRIBUTION FUNCTION BY NEW PLASMA SOURCE: HYBRID ELECTRON BEAM AND RF PLASMA

BACKGROUND OF THE INVENTION

Field of Invention

The present invention relates to systems and methods for substrate processing, and more particularly to a hybrid electron beam and radio frequency (RF) plasma system and method of using the same.

Description of Related Art

Plasma has been used in semiconductor processing to assist etch processes by facilitating the removal of material along fine lines or within vias patterned on a substrate. Etch processes that use plasma include capacitively or inductively coupled plasma, hallow cathode plasma, electron cyclotron resonance plasma, microwave surface wave plasma, and reactive ion etching (RIE). For example, RIE generates plasma via electromagnetic fields with high-energy ions to etch away unwanted materials of the substrate.

High-energy ions generated in RIE are difficult to control within the plasma. Consequently, there are several issues associated with RIE techniques that hinder the overall performance in etching the substrate due to the lack of control of the high-energy ions. Some RIE techniques have broad ion energy distribution (IED) that results in a broad ion beam used to etch the substrate. A broad ion beam decreases the precision required to adequately etch the substrate. Some RIE techniques have charge-induced side effects such as charge damage to the substrate. RIE techniques may also exhibit feature-shape loading effects such as micro loading. Micro loading results when an etching rate of the RIE increases due to a dense area of the substrate. The increased etching rate may result in damage to the substrate.

Some attempts to solve the technical problems described above have been made, such as the systems and methods described in U.S. Pat. No. 9,520,275 to Chen, entitled "Mono-Energetic Neutral Beam Activated Chemical Processing System and Method of Using," issued on Dec. 13, 2016 and resulting from U.S. patent application Ser. No. 12/053,008 filed on Mar. 21, 2008, and U.S. Patent App. Pub. No. 2014/0360670 of Chen et. al, entitled "Processing System for Non-Ambipolar Electron Plasma (NEP) Treatment of a Substrate With Sheath Potential," published on Dec. 11, 2014 and resulting from U.S. patent application Ser. No. 14/026,092 filed on Sep. 13, 2013, which are incorporated herein in entirety.

The methods and systems described by Chen in the documents cited above include formation of a first plasma in a first region and formation of a second plasma in a second region. In some systems, the first region and the second region are regions in a single processing chamber. In other systems, the first region and second region are separate chambers coupled by a means of coupling the first plasma and the second plasma. In the described methods, electrons from the first plasma provide energy required to ignite and/or maintain the second plasma. In such systems, the processing chamber that receives the workpiece is grounded. As described below, the methods and systems described herein present a technical improvement on the systems described in Chen and Chen et. al.

SUMMARY OF THE INVENTION

Embodiments of hybrid electron beam and RF plasma systems and methods are described. In an embodiment a method of using a hybrid electron beam and RF plasma system may include forming a first plasma of a first type in a first region of a wafer processing structure. Additionally, such a method may include forming a second plasma of a second type in a second region of the wafer processing structure, the second region of the wafer processing structure being coupled to the first region of the wafer processing structure, the second plasma being ignited independently of the first plasma, wherein an electron beam formed by the first plasma is configured to modulate one or more characteristics of the second plasma.

Another embodiment of a method may include forming a first plasma of a first type in a first region of a wafer processing structure. Additionally, such a method may include forming a second plasma of a second type in a second region of the wafer processing structure, the second region of the wafer processing structure being coupled to the first region of the wafer processing structure, the second plasma being maintained by a combination of energy received from a radio frequency (RF) energy source and from an electron beam introduced from the first plasma to the second plasma, wherein a ratio of energy from the electron beam formed by the first plasma and the energy received from the RF energy source is selectable to modulate one or more characteristics of the second plasma.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
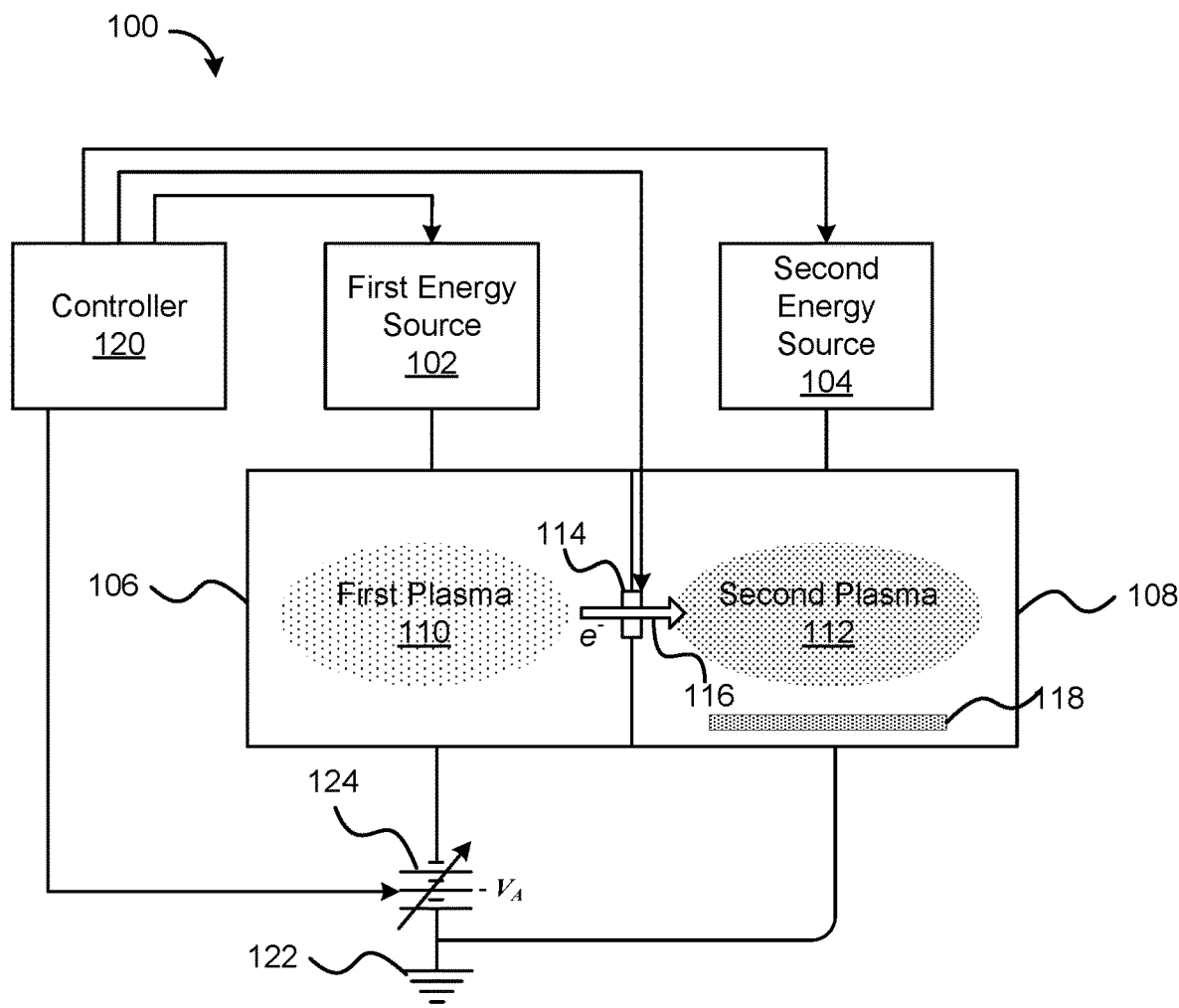
FIG. 1 illustrates one embodiment of a system for generating a hybrid electron beam and RF plasma.

Methods and systems for controlling plasma performance are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

FIG. 1 illustrates one embodiment of a system 100 for generating a hybrid plasma formed from energy from an electron beam energy source and an RF energy source. In an embodiment, the system 100 may include a first energy source 102 and a second energy source 104. The first energy source 102 may be coupled to a first region 106 of a wafer processing structure and the second energy source 104 may be coupled to a second region 108 of the wafer processing structure. In an embodiment, the wafer processing structure may include a single plasma processing chamber having two distinct regions corresponding to the first region 106 and the second region 108. Alternatively, the wafer processing structure may include a plurality of separate processing chambers defining the first region 106 and the second region 108 respectively.

In such embodiments, the first region 106 and the second region 108 may be communicatively coupled together via one or more channels 114. A channel 114 may be a conduit through or an aperture in one or more sidewalls defining the first region 106 and the second region 108. In one embodiment, a single channel 114 is defined. In another embodiment a plurality of channels 114 are defined. In an embodiment, the size of the channel 114 may be variable. In another embodiment, a number of channels 114 may be variable. In still a further embodiment, the channel structure is static, but one or more electric characteristics of the first plasma 110 is variable, via control of the first energy source 102.

As illustrated, the first energy source 102 may ignite and maintain a first plasma 110. The first plasma 110 may be an electron rich plasma. In one embodiment, the first energy source 102 may be an inductively coupled plasma (ICP) energy source. The ICP energy source may include a power generator and an antenna configured for ICP plasma generation. Alternatively, the first energy source is a transformer coupled plasma (TCP) energy source. In another embodiment, the first energy source 102 may be a hollow cathode plasma source. In further embodiments, the electrons for forming the electron beam 116 may be generated by a filament or any other suitable electron source that may be known or become known to one of ordinary skill in the art.

In an embodiment, the second energy source 104 may ignite the second plasma 112 and the electron beam 116 may be configured to modulate one or more characteristics of the second plasma 112. In an alternative embodiment, the second plasma 112 may be ignited by energy from the electron beam 116, and the second energy source 104 may provide energy for maintaining the second plasma 112, where the ratio of the energy from the electron beam 116 and the energy from the second energy source 104 may be controlled, via a controller 120, to modulate one or more characteristics of the second plasma 112. In still another embodiment, the second plasma 112 may be both ignited and maintained by the electron beam 116, and the second energy source 104 may provide energy for modulating one or more characteristics of the second plasma 112. The second energy source 104 may include one or more types of RF or microwave plasma sources, including a surface wave energy source, an ICP source, an electron cyclotron resonance (ECR) source, or a capacitively coupled plasma (CCP) source.

In an embodiment, electrons from the first plasma 110 may be directed to the second plasma 112 via a channel 114. In an embodiment, the channel 114 may form an electron beam 116 that is directed into the second plasma 112. In an embodiment, the electron beam 116 may modulate one or more characteristics of the second plasma 112. Specifically, the electron beam 116 may modulate the electron energy distribution function in the second plasma 112. In another embodiment, the electron beam 116 may ignite the second plasma 112, and the second energy source 104 may modulate one or more characteristics of the second plasma 112.

In an embodiment, the system 100 includes one or more components for supply electric energy to portions of the system 100 and for electrically grounding one or more components. In such an embodiment, the system 100 includes a connection to electrical ground 122 and an electric potential source 124. In one embodiment, the first region 106 may be electrically floated with respect to ground 122. In an embodiment, the electric potential source 124 may be coupled to the first region 106 and apply a negative electric potential to one or more components of the first region 106. In one embodiment, the electric potential source 124 may apply a negative electric potential to a surface of a plasma chamber defining the first region 106. In addition, at least a portion of the second region 108 may be electrically grounded by the electrical ground 122. In an embodiment, a surface of a plasma chamber defining the second region 108 may be coupled to the electrical ground 122.

In such embodiments, the negative electric potential applied to the first region 106 and the ground applied to the second region 108 may facilitate directing the electron beam 116 through the channel 114 and into the second plasma 112. In a further embodiment, such an arrangement may enhance one or more performance parameters of the second plasma 112 in a region proximate to the workpiece 118. The workpiece 118 may be, in an embodiment, a semiconductor wafer to be processed in the system 100. In one embodiment, the negative-to-ground arrangement described in FIG. 1 may be used to enhance bombardment of a surface of the workpiece 118 with electrons from the second plasma 112.

Figure 2:
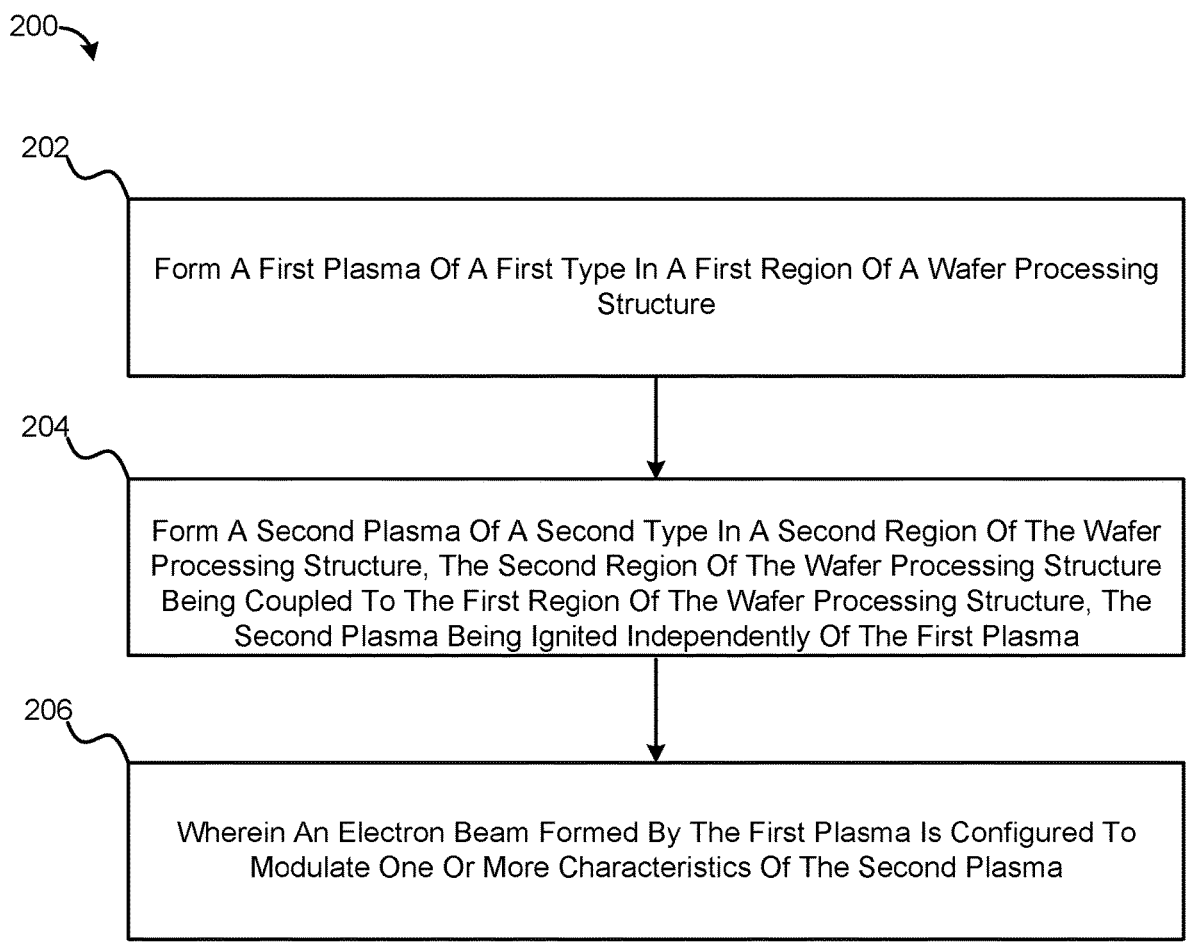
FIG. 2 illustrates one embodiment of a method for generating a hybrid electron beam and RF plasma.

FIG. 2 illustrates an embodiment of a method 200 of using a hybrid electron beam and RF plasma system 100. In one embodiment, the method 200 may include forming a first plasma of a first type in a first region of a wafer processing structure, as shown at block 202. Additionally, such a method 200 may include forming a second plasma of a second type in a second region of the wafer processing structure, the second region of the wafer processing structure being coupled to the first region of the wafer processing structure, the second plasma being ignited independently of the first plasma as shown at block 204. In an embodiment, an electron beam formed by the first plasma is configured to modulate one or more characteristics of the second plasma as shown at block 206.

Figure 3:
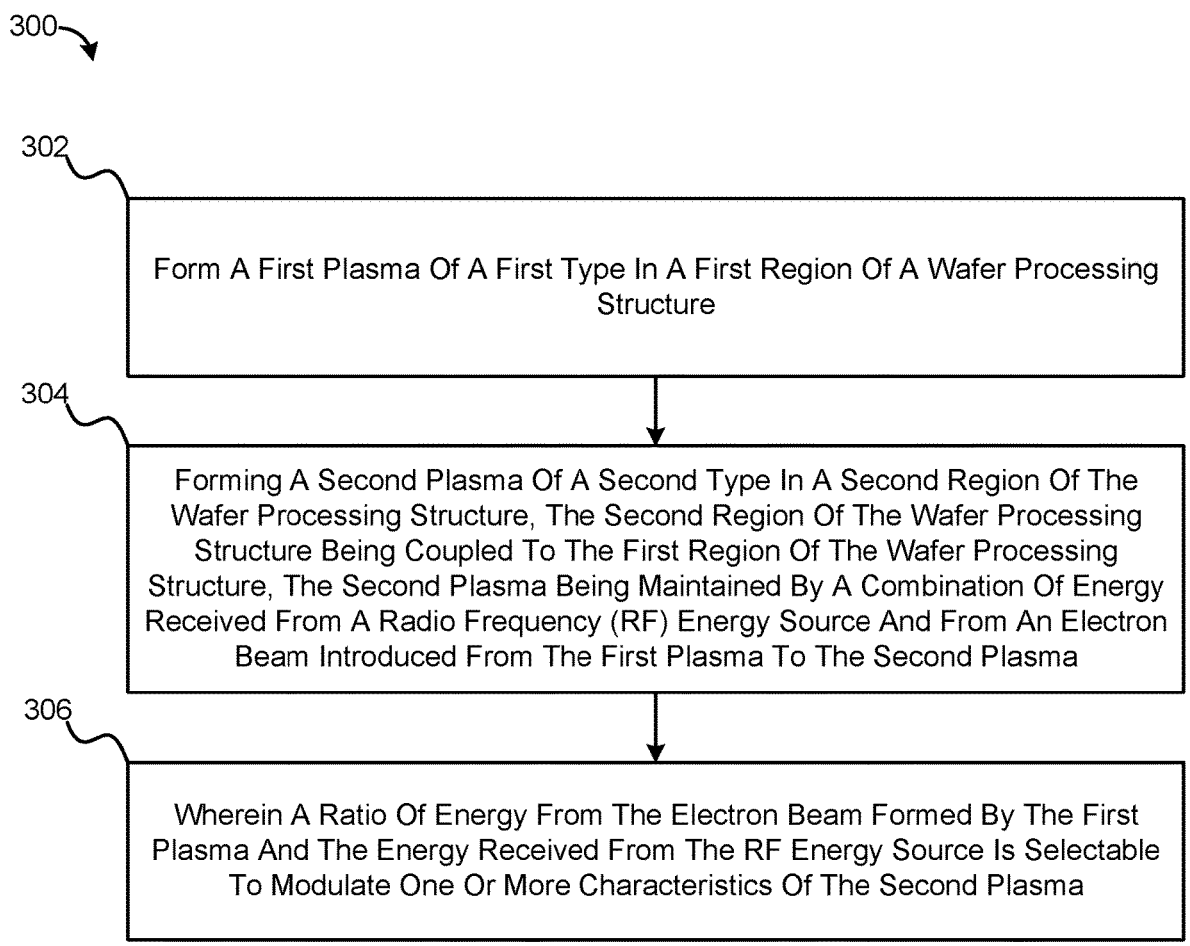
FIG. 3 illustrates one embodiment of a method for generating a hybrid electron beam and RF plasma.

FIG. 3 illustrates another embodiment of a method 300 of using a hybrid electron beam and RF plasma system 100. In an embodiment, the method 300 may include forming a first plasma of a first type in a first region of a wafer processing structure, as shown at block 302. Additionally, such a method 300 may include forming a second plasma of a second type in a second region of the wafer processing structure, the second region of the wafer processing structure being coupled to the first region of the wafer processing structure, the second plasma being maintained by a combination of energy received from a radio frequency (RF) energy source and from an electron beam introduced from the first plasma to the second plasma as shown at block 304. In such an embodiment, a ratio of energy from the electron beam formed by the first plasma and the energy received from the RF energy source is selectable to modulate one or more characteristics of the second plasma as shown at block 306.

Figure 4:
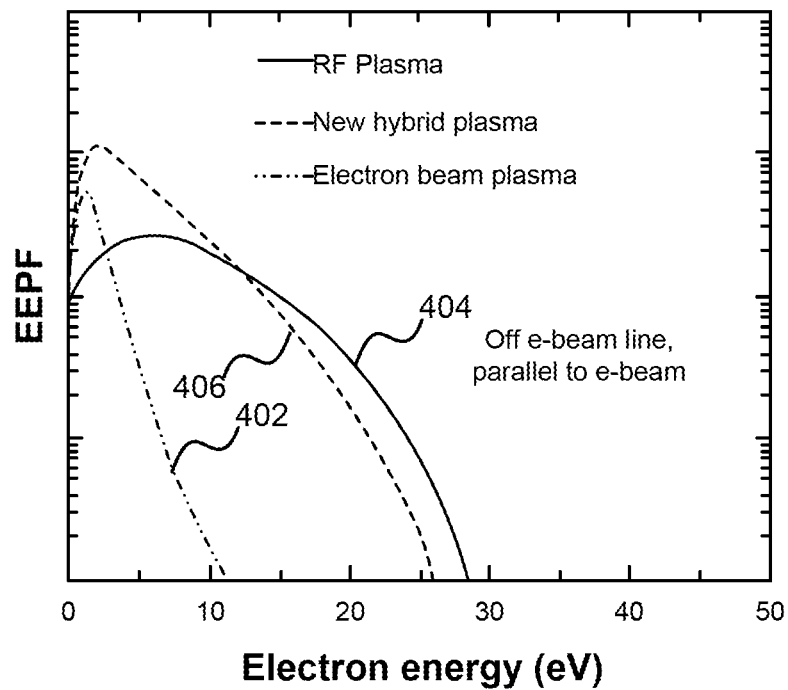
FIG. 4 is a diagram illustrating electron energy distribution function in a hybrid electron beam and RF plasma in a region parallel to the electron beam.

FIG. 4 is a graphical representation of the electron energy probability function (EEPF), a representation of electron density, with respect to electron energy measured in electron Volts (eV). Curve 402 represents the EEPF with respect to electron energy for the second plasma 112, where the second plasma 112 is formed solely from energy received from the electron beam 116. Curve 404 represents EEPF with respect to electron energy for the second plasma 112, where the second plasma is formed solely from energy received from the second energy source 104. Curve 406 represents a function of EEPF with respect to electron energy for a hybrid plasma formed from a combination of energy from the second energy source 104 and from the electron beam 116. In one embodiment, the electron energy curve may be measured off the electron beam line, and parallel to the electron beam 116. The electron energy of the hybrid plasma represented by curve 406 may be variable between bounds set by curves 402 and 404 respectively, in response to variations in the current and energy of the electron beam 116, the energy and the pressure from the second energy source 104. For example, the size or number of channels 114 may be varied to modify the electron beam 116. Alternatively, the first energy source 102 may be tuned to modify the electron beam 116.

There are several benefits of creating a tunable hybrid plasma, including an ability to perform an etch process that is more isotropic or more anisotropic depending upon the settings. Increasing the electron density may increase etch rates, and lowering the electron density may decrease etch rates. One of ordinary skill may recognize further benefits of a tunable system as described herein. For example, modification of the EEPF curve may modify the ionization rate in the second plasma 112, the chemical reaction on the wafer to precisely control etching profile and etching rate.

Figure 5:
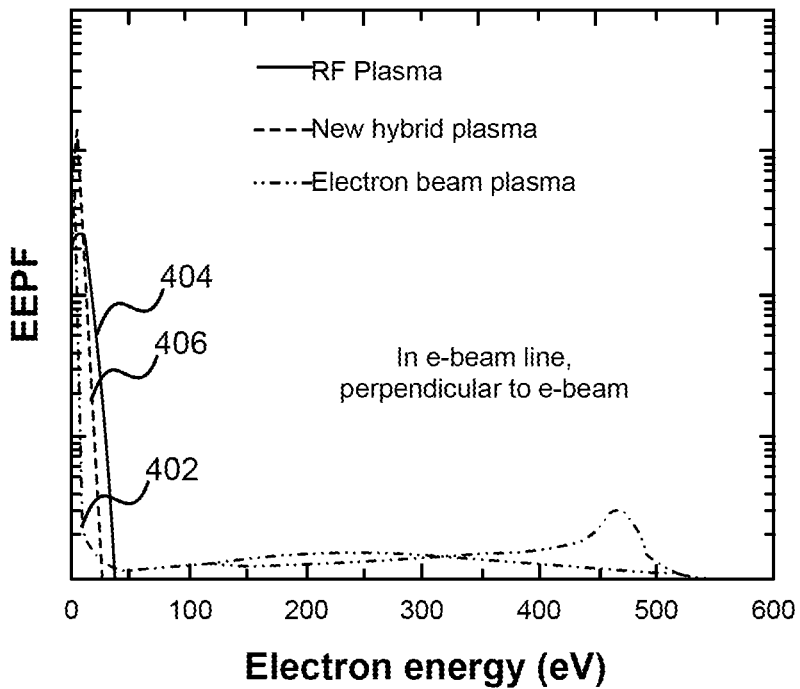
FIG. 5 is a diagram illustrating electron energy distribution function in a hybrid electron beam and RF plasma in a region perpendicular to the electron beam.

FIG. 5 is a graphical representation of the electron density (EEPF) with respect to electron energy, where the measurement is taken directly in the path of the electron beam 116 and perpendicular to the electron beam 116. FIG. 5 shows that the EEPF may be adjusted over a relatively wide range of electron energies, which can be beneficial for high aspect ratio etch processes.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A system for plasma processing of a substrate, comprising:
    a wafer processing structure comprising:
        a first region configured to form a first plasma of a first type through a first energy source;
        a second region coupled to the first region via one or more channels, the second region configured to form a second plasma of a second type through a second energy source, the second plasma being ignited independently of the first plasma;
        a negative electric potential source coupled a surface of a plasma chamber defining the first region, the negative electric potential source being different from the first energy source and the second energy source;
        an electrical ground connection configured to electrically connect at least one surface in the second region to a ground potential; and
        a controller coupled to each of the first energy source, the second energy source, the one or more channels, and the negative electric potential source for controlling each of the first energy source, the second energy source, the one or more channels, and the negative electric potential source, wherein:
    the controller is configured to:
        control the negative electric potential source to provide a negative electric potential to the surface of the plasma chamber defining the first region while the second region is grounded to the ground potential, the first plasma is formed in the first region, and the second plasma is formed in the second region to facilitate directing an electron beam formed by the first plasma into the second plasma, select a ratio of energy from the electron beam formed by the first plasma and energy from the second energy source, and control the first energy source and the second energy source at the selected ratio to modulate one or more characteristics of the second plasma.

2. The system of claim 1, wherein
the second energy source includes a radio frequency (RF) energy source, and
the controller is configured to control the RF energy source to ignite the second plasma.

3. The system of claim 1, wherein
the second energy source includes a radio frequency (RF) energy source, and
the controller is configured to control the RF energy source to at least partially maintain the second plasma.

4. The system of claim 1, wherein
the first energy source is coupled to the first region, and
the controller is configured to control the first energy source to ignite and to maintain the first plasma for directing the electron beam from the first plasma into the second plasma to modulate the one or more characteristics of the second plasma.

5. The system of claim 4, wherein the first energy source comprises at least one of an inductively coupled plasma (ICP) energy source, a transformer coupled plasma (TCP) energy source, a hollow cathode plasma source, or a filament.

6. The system of claim 1, wherein:
the second energy source is coupled to the second region;
the second energy source is configured to ignite, maintain, or modulate the second plasma; and
the second energy source includes at least one of a radio frequency (RF) plasma source, a microwave plasma source, a surface wave energy source, an inductively coupled plasma (ICP) energy source, an electron cyclotron resonance (ECR) energy source, or a capacitively coupled plasma (CCP) energy source.

7. The system of claim 1, wherein the one or more channels are coupled between the first region and the second region and configured to direct the electron beam from the first region to the second region.

8. The system of claim 7, wherein each of the one or more channels between the first region and the second region has a respective size.

* * * * *